United States Patent
Miyazaki et al.

(10) Patent No.: US 10,352,990 B2
(45) Date of Patent: Jul. 16, 2019

(54) FAILURE DIAGNOSIS CIRCUIT AND FAILURE DIAGNOSIS METHOD

(71) Applicant: KABUSHIKI KAISHA TOKAI RIKA DENKI SEISAKUSHO, Aichi (JP)

(72) Inventors: Shinichi Miyazaki, Aichi (JP); Tatsuya Suzuki, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 15/578,351

(22) PCT Filed: Apr. 6, 2016

(86) PCT No.: PCT/JP2016/061246
§ 371 (c)(1),
(2) Date: Nov. 30, 2017

(87) PCT Pub. No.: WO2017/006603
PCT Pub. Date: Jan. 12, 2017

(65) Prior Publication Data
US 2018/0149694 A1  May 31, 2018

(30) Foreign Application Priority Data
Jul. 7, 2015 (JP) .................................. 2015-136108

(51) Int. Cl.
*G01R 31/28* (2006.01)
*G01R 31/02* (2006.01)
(Continued)

(52) U.S. Cl.
CPC .............. *G01R 31/28* (2013.01); *G01R 31/02* (2013.01); *H02H 7/00* (2013.01); *H02H 7/205* (2013.01); *H02H 11/003* (2013.01); *H02P 7/00* (2013.01)

(58) Field of Classification Search
CPC ....... H01L 21/00; H01L 2221/00; H02H 1/00; H02J 1/00; H02M 1/00
See application file for complete search history.

(56) References Cited

U.S. PATENT DOCUMENTS

2004/0136129 A1    7/2004  Amada et al.
2006/0001099 A1 *  1/2006  Motz .................. H01L 29/7801
                                                       257/355
(Continued)

FOREIGN PATENT DOCUMENTS

DE    10 2011 057002    6/2013
JP    2012-065405       3/2012
(Continued)

OTHER PUBLICATIONS

International Search Report, dated Jun. 14, 2016 by the Japan Patent Office (JPO), in corresponding International Application No. PCT/JP2016/061246.

*Primary Examiner* — Jermele M Hollington
*Assistant Examiner* — Temilade S Rhodes-Vivour
(74) *Attorney, Agent, or Firm* — Greenblum & Bernstein, P.L.C.

(57) ABSTRACT

A failure diagnosis circuit configured to diagnose an open-circuit failure in a reverse connection protection transistor includes a power supply unit having a switching transistor electrically connected to a power source and the reverse connection protection transistor and is brought into an on state or an off state in response to a control signal, and in which power is supplied from the power source to the reverse connection protection transistor when the switching transistor is in the on state; a power supply control unit that controls power supply to the reverse connection protection transistor and stop of the power supply by outputting the control signal to the switching transistor; and a diagnosis unit that diagnoses an open-circuit failure in the reverse (Continued)

connection protection transistor on the basis of an output state of the control signal and a detection result of voltage between the switching transistor and the reverse connection protection transistor.

6 Claims, 5 Drawing Sheets

(51) Int. Cl.
*H02H 7/00* (2006.01)
*H02P 7/00* (2016.01)
*H02H 7/20* (2006.01)
*H02H 11/00* (2006.01)

(56) References Cited

U.S. PATENT DOCUMENTS

| | | | |
|---|---|---|---|
| 2008/0247108 A1* | 10/2008 | Ando | H02H 7/0833 361/84 |
| 2009/0026993 A1* | 1/2009 | Nishibe | H02P 7/04 318/490 |
| 2009/0146628 A1* | 6/2009 | Nakahara | H03K 17/08122 323/282 |
| 2009/0147422 A1* | 6/2009 | Nakahara | H03K 17/0822 361/84 |
| 2012/0212159 A1 | 8/2012 | Kitamoto | |
| 2012/0299599 A1 | 11/2012 | Naruse et al. | |
| 2015/0152820 A1 | 6/2015 | Kojima | |

FOREIGN PATENT DOCUMENTS

| | | |
|---|---|---|
| JP | 2012-188101 | 10/2012 |
| JP | 2012-242330 | 12/2012 |
| JP | 2015-047035 | 3/2015 |
| JP | 2015-105605 | 6/2015 |
| JP | 2015-171305 | 9/2015 |

\* cited by examiner

FAILURE DIAGNOSIS CIRCUIT AND FAILURE DIAGNOSIS METHOD

TECHNICAL FIELD

The present invention relates to a failure diagnosis circuit and a failure diagnosis method.

BACKGROUND ART

In the case where the polarity of a power source connected to a load is in a state (hereinafter referred to as "reverse connection state") that is opposite to a normal state, a reverse connection protection transistor may be used to protect the load. In the case of the reverse connection state, the reverse connection protection transistor serves to prevent flow of current in a direction opposite to that in the normal state.

In the case where the reverse connection protection transistor does not work normally in the reverse connection state, current in a direction opposite to that in the normal state flows in the load. Therefore, in the case where the reverse connection protection transistor does not work normally in the reverse connection state, an undesirable situation, such as a failure in the load, may occur.

Under such circumstances, a technology for diagnosing a failure in a reverse connection protection transistor has been developed. An example of the technology for diagnosing a failure in a reverse connection protection transistor is the technology described in Patent Literature 1.

CITATION LIST

Patent Literature

Patent Literature 1: JP 2012-65405A

SUMMARY OF INVENTION

Technical Problem

For example, in a motor control device to which the technology described in Patent Literature 1 is applied (hereinafter referred to as "conventional motor control device"), reverse connection protection means is provided between a battery and a motor. The reverse connection protection means is configured with a metal-oxide-semiconductor field effect transistor (MOSFET), and the MOSFET serves as a switching element and reverse connection protection means.

In the conventional motor control device, "a difference between a potential difference (hereinafter referred to as "first potential difference") between the upstream side and the downstream side of the reverse connection protection means when the switching element is in an off state and a potential difference (hereinafter referred to as "second potential difference") between the upstream side and the downstream side of the reverse connection protection means when the switching element is in an on state" is compared with a threshold value set in advance; thus, a failure in the reverse connection protection means is diagnosed. Hence, there is a possibility that using the technology described in Patent Literature 1, for example, enables diagnosis of a failure in the reverse connection protection means of the MOSFET serving as reverse connection protection means, that is, a failure in a reverse connection protection transistor.

However, to diagnose a failure in the reverse connection protection transistor using the technology described in Patent Literature 1, it is necessary to switch the state of the switching element and measure the first potential difference and the second potential difference, then calculate the difference between the first potential difference and the second potential difference, and, furthermore, compare the calculated difference with the set threshold value. Therefore, in the case of using the technology described in Patent Literature 1, for example, easy diagnosis of a failure in the reverse connection protection transistor cannot be expected.

The present invention has been made in view of the above problem, and an object of the present invention is to provide a novel and improved failure diagnosis circuit and failure diagnosis method capable of diagnosing an open-circuit failure in a reverse connection protection transistor.

Solution to Problem

According to a first aspect of the present invention in order to achieve the above-mentioned object, there is provided a failure diagnosis circuit configured to diagnose an open-circuit failure in a reverse connection protection transistor that prevents flow of current in a direction opposite to a direction in a normal state in the case of a reverse connection state, the failure diagnosis circuit including: a power supply unit which includes a switching transistor that is electrically connected to a power source and the reverse connection protection transistor and is brought into an on state or an off state in response to a control signal applied to a control terminal, and in which power is supplied from the power source to the reverse connection protection transistor when the switching transistor is in the on state; a power supply control unit that controls power supply to the reverse connection protection transistor and stop of the power supply by outputting the control signal to the switching transistor; and a diagnosis unit that diagnoses an open-circuit failure in the reverse connection protection transistor on the basis of an output state of the control signal and a detection result of voltage between the switching transistor and the reverse connection protection transistor.

This configuration makes it possible to diagnose an open-circuit failure in a reverse connection protection transistor.

The diagnosis unit may diagnose an open-circuit failure in the reverse connection protection transistor on the basis of a change in the voltage after power supply to the reverse connection protection transistor is stopped.

The diagnosis unit may make a diagnosis that an open-circuit failure has occurred in the reverse connection protection transistor in the case where a fall in the voltage is not detected after power supply to the reverse connection protection transistor is stopped.

The diagnosis unit may refrain from making a diagnosis that an open-circuit failure has occurred in the reverse connection protection transistor in the case where a fall in the voltage is detected after power supply to the reverse connection protection transistor is stopped.

The reverse connection protection transistor may be further included.

According to a second aspect of the present invention in order to achieve the above-mentioned object, there is provided a failure diagnosis method in a failure diagnosis circuit configured to diagnose an open-circuit failure in a reverse connection protection transistor that prevents flow of current in a direction opposite to a direction in a normal state in the case of a reverse connection state. The failure diagnosis circuit includes a switching transistor that is electrically connected to a power source and the reverse connection protection transistor and is brought into an on state or an off state in response to a control signal applied to a control terminal. The failure diagnosis method includes: controlling power supply to the reverse connection protection transistor and stop of the power supply by outputting the control signal to the switching transistor; and diagnosing an open-circuit failure in the reverse connection protection transistor on the basis of an output state of the control signal and a detection result of voltage between the switching transistor and the reverse connection protection transistor.

Using this method makes it possible to diagnose an open-circuit failure in a reverse connection protection transistor.

Advantageous Effects of Invention

According to the present invention, an open-circuit failure in a reverse connection protection transistor can be diagnosed.

DESCRIPTION OF EMBODIMENTS

Hereinafter, (a) preferred embodiment(s) of the present invention will be described in detail with reference to the appended drawings. In this specification and the appended drawings, structural elements that have substantially the same function and structure are denoted with the same reference numerals, and repeated explanation of these structural elements is omitted.

In addition, in the following, "one structural element and another structural element are connected together" means that "one structural element concerned and another structural element concerned are electrically connected without intervention of a further another structural element" or that "one structural element concerned and another structural element concerned are electrically connected with intervention of the further another structural element".

(Failure Diagnosis Circuit According to Embodiment of the Present Invention)

[1] Example of Configuration of Failure Diagnosis Circuit

Before describing an example of a configuration of a failure diagnosis circuit according to an embodiment of the present invention, description will be given on an example of a configuration of a failure diagnosis circuit capable of diagnosing an open-circuit failure (off failure) in a reverse connection protection transistor.

Figure 1:
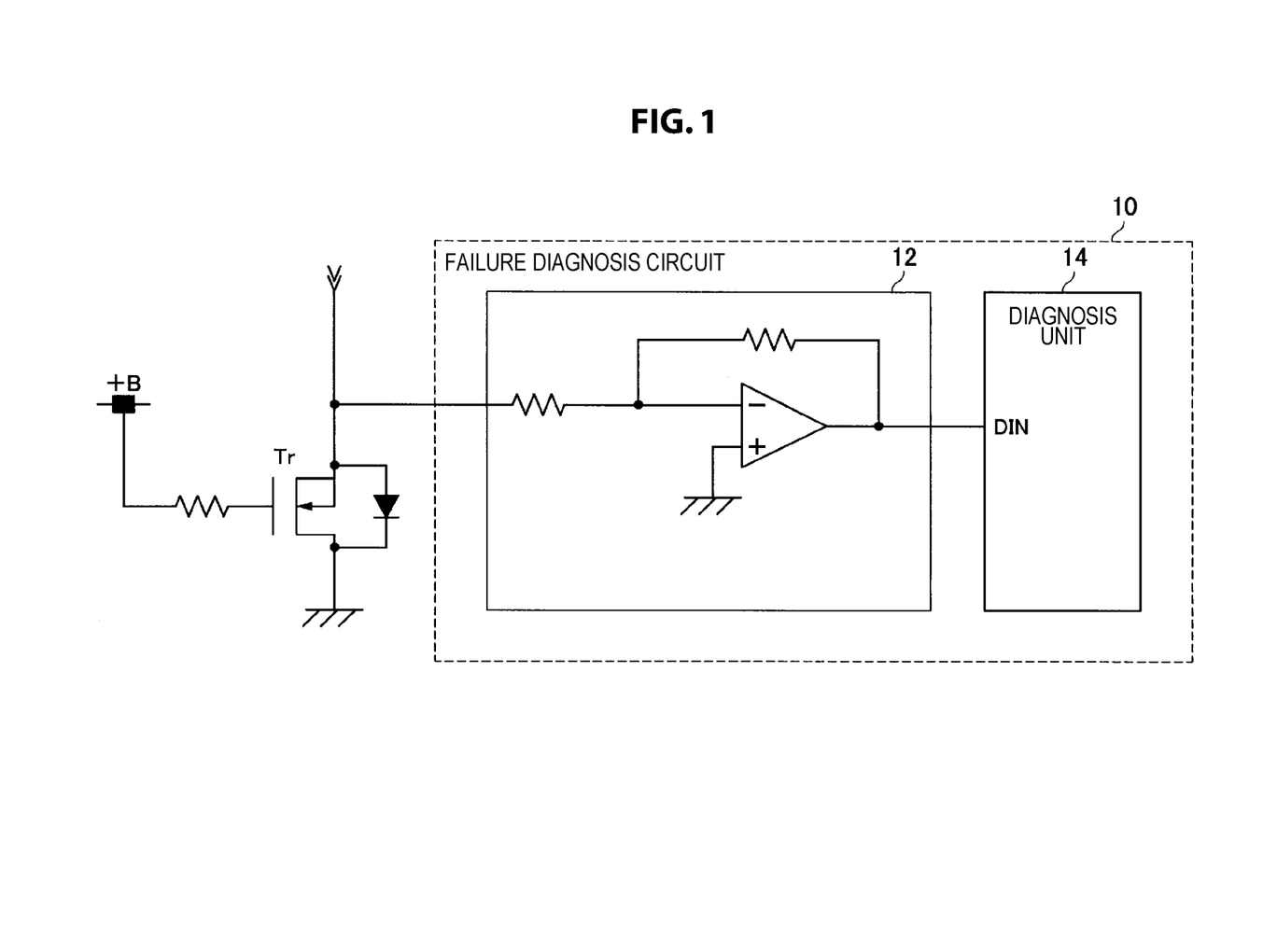
FIG. 1 is an explanatory diagram illustrating an example of a configuration of a failure diagnosis circuit that diagnoses an open-circuit failure in a reverse connection protection transistor.

FIG. 1 is an explanatory diagram illustrating an example of a configuration of a failure diagnosis circuit 10 that diagnoses an open-circuit failure in a reverse connection protection transistor. FIG. 1 also illustrates a reverse connection protection transistor Tr that is connected to a load (not illustrated), such as an electronic control unit (ECU) for door control and a motor, and a ground (reference potential; the same applies to the following description).

Examples of the reverse connection protection transistor Tr include a field-effect transistor (FET) such as a MOSFET. Although FIG. 1 illustrates an example in which the reverse connection protection transistor Tr is an N-channel MOSFET, the reverse connection protection transistor Tr is not limited to this example. For example, the reverse connection protection transistor Tr may be any transistor that can be used as a reverse connection protection transistor, such as a P-channel MOSFET.

In the reverse connection protection transistor Tr, a parasitic diode of the reverse connection protection transistor Tr, for example, prevents flow of current in a direction opposite to that in a normal state in the case of a reverse connection state.

The failure diagnosis circuit 10 includes, for example, an amplification unit 12 and a diagnosis unit 14.

The amplification unit 12 is configured with, for example, an amplifier circuit such as an operational amplifier. The amplifier circuit is connected between the load (not illustrated) and the reverse connection protection transistor Tr, and amplifies drain-source voltage of the reverse connection protection transistor Tr.

The diagnosis unit 14 is configured with, for example, a processor, such as a central processing unit (CPU), or a microcontroller.

The diagnosis unit 14 diagnoses an open-circuit failure in the reverse connection protection transistor Tr on the basis of voltage input to a terminal DIN, which is voltage output from the amplification unit 12 (amplified drain-source voltage of the reverse connection protection transistor Tr).

More specifically, the diagnosis unit 14 compares a value of voltage output from the amplification unit 12 when the reverse connection protection transistor Tr is in an on state, for example, with a threshold value for open-circuit failure diagnosis. Then, the diagnosis unit 14 diagnoses an open-circuit failure in the reverse connection protection transistor Tr on the basis of a comparison result. For example, in the case where the value of the voltage is smaller than the threshold value (or in the case where the value of the voltage is the threshold value or less), the diagnosis unit 14 makes a diagnosis that an open-circuit failure has not occurred in the reverse connection protection transistor Tr. For example, in the case where the value of the voltage is the threshold value or more (or in the case where the value of the voltage is larger than the threshold value), the diagnosis unit 14 makes a diagnosis that an open-circuit failure has occurred in the reverse connection protection transistor Tr.

As described above, the failure diagnosis circuit 10 diagnoses an open-circuit failure in the reverse connection protection transistor Tr on the basis of the drain-source voltage of the reverse connection protection transistor Tr when the reverse connection protection transistor Tr is in the on state. Thus, using the failure diagnosis circuit 10 facilitates diagnosing an open-circuit failure in the reverse connection protection transistor Tr as compared with the case of using the technology described in Patent Literature 1, for example.

However, a voltage drop Vf due to the parasitic diode of the reverse connection protection transistor Tr is very small.

In addition, the voltage drop Vf due to the parasitic diode of the reverse connection protection transistor Tr varies depending on variation of the reverse connection protection transistor Tr. Furthermore, the voltage drop Vf due to the parasitic diode of the reverse connection protection transistor Tr may also fluctuate depending on the temperature of the reverse connection protection transistor Tr.

Therefore, in the case of diagnosing an open-circuit failure in the reverse connection protection transistor Tr on the basis of the drain-source voltage of the reverse connection protection transistor Tr, as in the failure diagnosis circuit 10, it is difficult to ensure diagnosis precision.

[2] Failure Diagnosis Circuit According to Embodiment of the Present Invention and Failure Diagnosis Method According to Embodiment of the Present Invention Next, description will be given on an example of a configuration of a failure diagnosis circuit according to an embodiment of the present invention that is capable of diagnosing an open-circuit failure in a reverse connection protection transistor by a failure diagnosis method according to an embodiment of the present invention. Described below are an example of a configuration of a failure diagnosis circuit according to an embodiment of the present invention and a failure diagnosis method according to an embodiment of the present invention.

Figure 2:
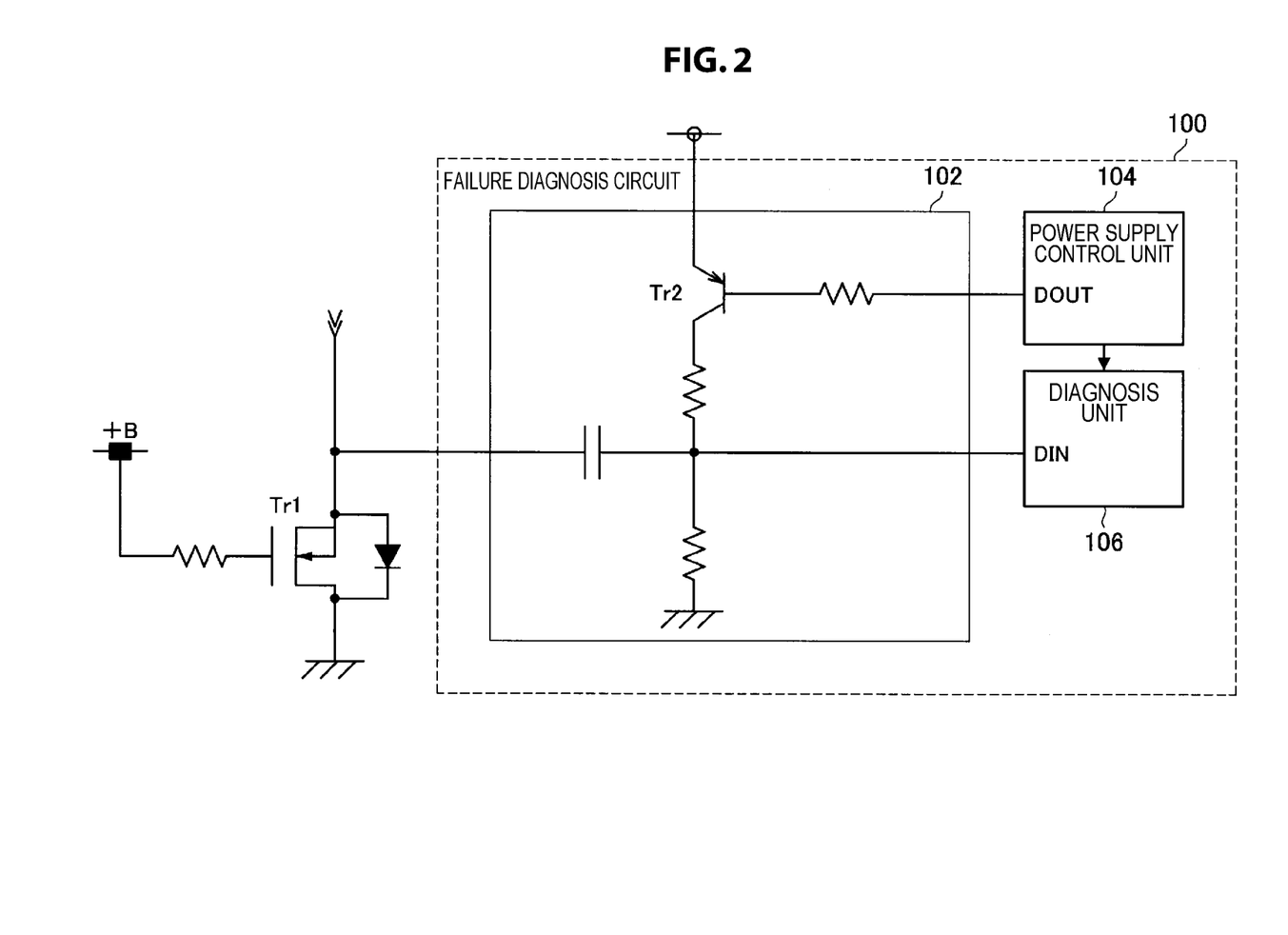
FIG. 2 is an explanatory diagram illustrating an example of a configuration of a failure diagnosis circuit according to an embodiment of the present invention.

FIG. 2 is an explanatory diagram illustrating an example of a configuration of a failure diagnosis circuit 100 according to an embodiment of the present invention. FIG. 2 also illustrates a reverse connection protection transistor Tr1 that is connected to a load (not illustrated), such as an ECU for door control and a motor, and a ground.

Examples of the reverse connection protection transistor Tr1 include a FET such as a MOSFET. FIG. 2 illustrates an example in which the reverse connection protection transistor Tr1 is an N-channel MOSFET, like the reverse connection protection transistor Tr illustrated in FIG. 1. Note that the reverse connection protection transistor Tr1 may be any transistor that can be used as a reverse connection protection transistor, such as a P-channel MOSFET.

The failure diagnosis circuit 100 includes, for example, a power supply unit 102, a power supply control unit 104, and a diagnosis unit 106.

The power supply control unit 104 and the diagnosis unit 106 are configured with, for example, a processor, such as a CPU, or a microcontroller. In the failure diagnosis circuit 100, for example, one microcontroller serves as the power supply control unit 104 and the diagnosis unit 106. The failure diagnosis circuit 100 may have a configuration including a microcontroller serving as the power supply control unit 104 and a microcontroller serving as the diagnosis unit 106, for example.

[2-1] Power Supply Unit 102

Figure 4:
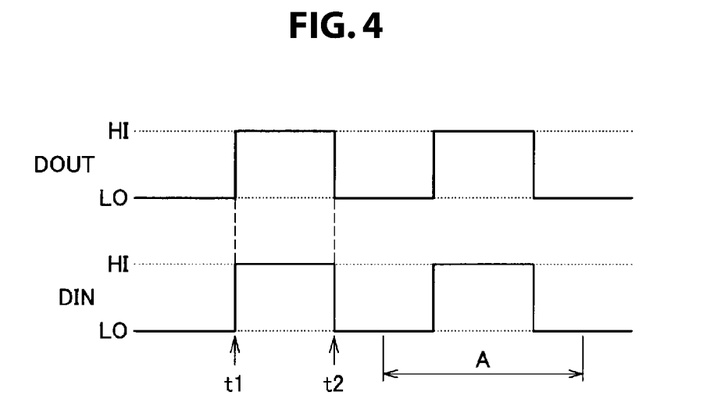
FIG. 4 is an explanatory diagram for describing a failure diagnosis method for a reverse connection protection transistor in a failure diagnosis circuit according to an embodiment of the present invention.
Figure 5:
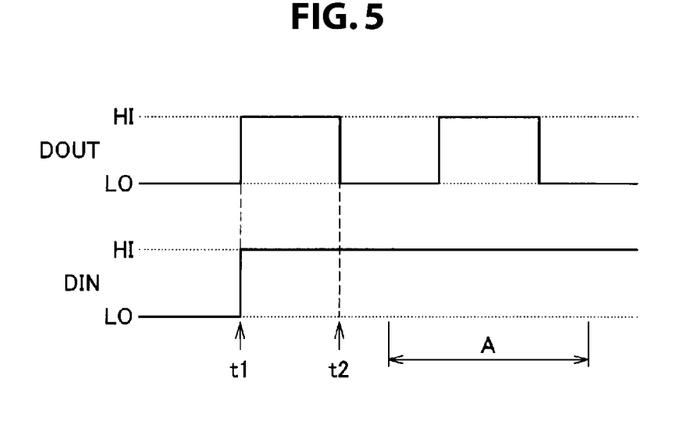
FIG. 5 is an explanatory diagram for describing a failure diagnosis method for a reverse connection protection transistor in a failure diagnosis circuit according to an embodiment of the present invention.

The power supply unit 102 includes a switching transistor Tr2 that is brought into an on state or an off state in response to a control signal applied to a control terminal. Note that an example of the control signal is shown in FIGS. 4 and 5 described later.

The switching transistor Tr2 is connected to a power source (not illustrated) and the reverse connection protection transistor Tr1. In addition, the switching transistor Tr2 is connected, via a resistor, to a ground having the same potential as the ground to which the reverse connection protection transistor Tr1 is connected.

In the power supply unit 102, power is supplied from the power source (not illustrated) to the reverse connection protection transistor Tr1 when the switching transistor Tr2 is in the on state.

Here, examples of the switching transistor Tr2 include a bipolar transistor, and a FET such as a thin film transistor (TFT) and a MOSFET.

Although an example in which the switching transistor Tr2 is a PNP type bipolar transistor is illustrated in FIG. 2, the switching transistor Tr2 according to an embodiment of the present invention is not limited to the above-mentioned example. For example, the switching transistor Tr according to an embodiment of the present invention may be an NPN type bipolar transistor, a P-channel type TFT or an N-channel type TFT. Further, the switching transistor Tr2 according to an embodiment of the present invention may be any circuit element as long as it is possible for the circuit element to serve as a switching element which is brought into the on state or the off state in response to the control signal (described later).

Examples of the power source (not illustrated) include a secondary cell, such as a battery, and a fuel cell. The power source (not illustrated) may be, for example, a power source included in a "system or equipment including a reverse connection protection transistor", or may be an external power source connected to the "system or equipment including a reverse connection protection transistor".

Figure 3:
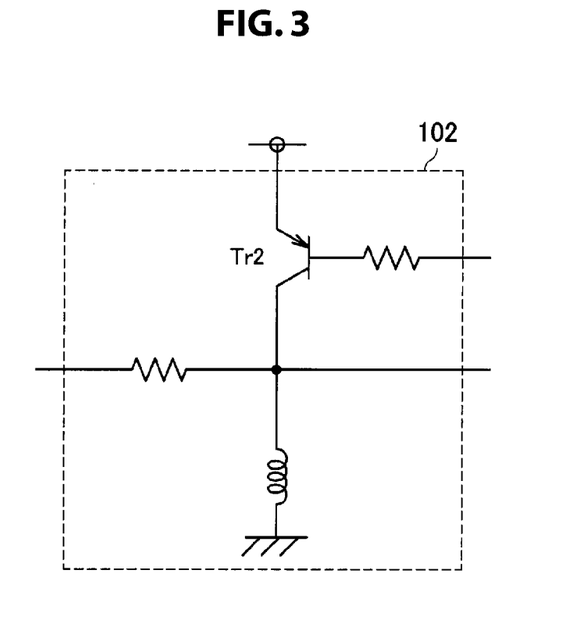
FIG. 3 is an explanatory diagram illustrating another configuration of a power supply unit in a failure diagnosis circuit according to an embodiment of the present invention.

Note that the configuration of the power supply unit 102 is not limited to the configuration illustrated in FIG. 2. FIG. 3 is an explanatory diagram illustrating another configuration of the power supply unit 102 in the failure diagnosis circuit 100 according to an embodiment of the present invention. FIG. 3 illustrates the power supply unit 102 part of the failure diagnosis circuit 100 illustrated in FIG. 2.

Also in the case where the power supply unit 102 has the configuration illustrated in FIG. 3, the failure diagnosis circuit according to an embodiment of the present invention can diagnose an open-circuit failure in the reverse connection protection transistor Tr1 in the diagnosis unit 106, as in the case where the power supply unit 102 has the configuration illustrated in FIG. 2.

[2-2] Power Supply Control Unit 104

The power supply control unit 104 outputs a control signal to the switching transistor Tr2, thereby controlling power supply to the reverse connection protection transistor Tr1 and stop of the power supply. The power supply control unit 104 generates a control signal and outputs the generated control signal from a terminal DOUT to control the on state and off state of the switching transistor Tr2, thereby controlling power supply to the reverse connection protection transistor Tr1 and stop of the power supply.

In addition, the power supply control unit 104 transmits data indicating an output state of the control signal, for example, to the diagnosis unit 106. For example, the power supply control unit 104 transmitting data indicating an output state of the control signal to the diagnosis unit 106 allows the diagnosis unit 106 to grasp the output state of the control signal.

[2-3] Diagnosis Unit 106

The diagnosis unit 106 diagnoses an open-circuit failure in the reverse connection protection transistor Tr1 on the basis of the output state of the control signal and voltage input to a terminal DIN. Here, the voltage input to the terminal DIN corresponds to a detection result of voltage between the switching transistor Tr2 and the reverse connection protection transistor Tr1.

More specifically, the diagnosis unit 106 diagnoses an open-circuit failure in the reverse connection protection transistor Tr1 on the basis of a change in the voltage input to the terminal DIN after power supply to the reverse connection protection transistor Tr1 is stopped.

Here, a failure diagnosis method according to an embodiment of the present invention will be described. FIGS. 4 and 5 are explanatory diagrams for describing a failure diagnosis method for the reverse connection protection transistor Tr1 in the failure diagnosis circuit 100 according to an embodiment of the present invention.

FIG. 4 illustrates an example of the relationship between the control signal (DOUT in FIG. 4) and the voltage input to the terminal DIN (DIN in FIG. 4) when no failure has occurred in the reverse connection protection transistor Tr1 and the reverse connection protection transistor Tr1 is in the on state. FIG. 5 illustrates an example of the relationship between the control signal (DOUT in FIG. 5) and the voltage input to the terminal DIN (DIN in FIG. 5) when an open-circuit failure has occurred in the reverse connection protection transistor Tr1.

Note that DIN in FIG. 4 and DIN in FIG. 5 indicate cases where the voltage input to the terminal DIN is converted to high-level voltage and low-level voltage by a comparator of a microcontroller or the like, for example.

(1) Case where No Failure has Occurred in Reverse Connection Protection Transistor Tr1 (FIG. 4)

A high-level control signal is applied to the switching transistor Tr2 to bring the switching transistor Tr2 into the on state; thus, power is supplied to the reverse connection protection transistor Tr1. At this time, the voltage input to the terminal DIN rises with the power supply to the reverse connection protection transistor Tr1 (e.g., t1 in FIG. 4).

After that, a low-level control signal is applied to the switching transistor Tr2 to bring the switching transistor Tr2 into the off state; thus, power supply to the reverse connection protection transistor Tr1 is stopped. In the case where no failure has occurred in the reverse connection protection transistor Tr1 and the reverse connection protection transistor Tr1 is in the on state, discharge via the reverse connection protection transistor Tr1 is performed. Therefore, the voltage input to the terminal DIN falls with the stop of power supply to the reverse connection protection transistor Tr1 (e.g., t2 in FIG. 4).

(2) Case where Open-Circuit Failure has Occurred in Reverse Connection Protection Transistor Tr1 (FIG. 5)

A high-level control signal is applied to the switching transistor Tr2 to bring the switching transistor Tr2 into the on state; thus, power is supplied to the reverse connection protection transistor Tr1. At this time, the voltage input to the terminal DIN rises with the power supply to the reverse connection protection transistor Tr1 (e.g., t1 in FIG. 5).

After that, a low-level control signal is applied to the switching transistor Tr2 to bring the switching transistor Tr2 into the off state; thus, power supply to the reverse connection protection transistor Tr1 is stopped. In the case where an open-circuit failure has occurred in the reverse connection protection transistor Tr1, discharge via the reverse connection protection transistor Tr1 is not performed. Therefore, even after power supply to the reverse connection protection transistor Tr1 is stopped, the voltage input to the terminal DIN does not fall as in FIG. 4 (e.g., t2 in FIG. 5).

It is possible to diagnose whether an open-circuit failure has occurred in the reverse connection protection transistor Tr1 by checking whether there is a change in the voltage input to the terminal DIN after power supply to the reverse connection protection transistor Tr1 is stopped, as illustrated in FIGS. 4 and 5, for example.

Hence, in the failure diagnosis circuit 100, the power supply control unit 104 controls power supply to the reverse connection protection transistor Tr1 and stop of the power supply.

In addition, in the failure diagnosis circuit 100, the diagnosis unit 106 diagnoses an open-circuit failure in the reverse connection protection transistor Tr1 on the basis of a change in the voltage input to the terminal DIN after power supply to the reverse connection protection transistor Tr1 is stopped.

More specifically, in the case where a fall in the voltage input to the terminal DIN is detected after power supply to the reverse connection protection transistor Tr1 is stopped as illustrated in A of FIG. 4, for example, the diagnosis unit 106 does not make a diagnosis that an open-circuit failure has occurred in the reverse connection protection transistor Tr1. The diagnosis unit 106 may make a diagnosis that an open-circuit failure has not occurred in the reverse connection protection transistor Tr1 in the case where a fall in the voltage input to the terminal DIN is detected after power supply to the reverse connection protection transistor Tr1 is stopped, for example. Here, A of FIG. 4 indicates an example of a period during which the diagnosis unit 106 performs processing for diagnosis in the case where power supply to the reverse connection protection transistor Tr1 is stopped at t2 in FIG. 4.

In addition, in the case where a fall in the voltage input to the terminal DIN is not detected after power supply to the reverse connection protection transistor Tr1 is stopped as illustrated in A of FIG. 5, for example, the diagnosis unit 106 makes a diagnosis that an open-circuit failure has occurred in the reverse connection protection transistor Tr1. Here, A of FIG. 5 indicates an example of a period during which the diagnosis unit 106 performs processing for diagnosis in the case where power supply to the reverse connection protection transistor Tr1 is stopped at t2 in FIG. 5.

As described above, in the failure diagnosis circuit 100, which diagnoses an open-circuit failure in the reverse connection protection transistor Tr1 by a failure diagnosis method according to an embodiment of the present invention, it is diagnosed whether an open-circuit failure has occurred in the reverse connection protection transistor Tr1 in the following manner: "the diagnosis unit 106 diagnoses an open-circuit failure in the reverse connection protection transistor Tr1, on the basis of the output state of the control signal in the power supply control unit 104, and the voltage input to the terminal DIN".

A failure diagnosis circuit according to an embodiment of the present invention has the configuration illustrated in FIG. 2, for example.

[2-4] Modification Example of Failure Diagnosis Circuit According to Embodiment of the Present Invention The configuration of a failure diagnosis circuit according to an embodiment of the present invention is not limited to the configuration according to the failure diagnosis circuit 100 described above.

For example, a failure diagnosis circuit according to an embodiment of the present invention may have a configuration including a reverse connection protection transistor that is targeted for failure diagnosis.

In addition, a failure diagnosis circuit according to an embodiment of the present invention may further include a notification control unit that controls issuance of a notification of a diagnosis result in the diagnosis unit 106.

The notification control unit is configured with, for example, a processor, such as a CPU, or a microcontroller. In the case where the notification control unit is included, in the failure diagnosis circuit according to an embodiment of the present invention, for example, one microcontroller serves as the power supply control unit 104, the diagnosis unit 106, and the notification control unit. In the failure diagnosis circuit according to an embodiment of the present invention, for example, a plurality of microcontrollers may implement the functions of the power supply control unit 104, the diagnosis unit 106, and the notification control unit.

In the case where the diagnosis unit 106 makes a diagnosis that an open-circuit failure has occurred in the reverse connection protection transistor, for example, the notification control unit transmits a sound signal (a warning sound and music are also included) which indicates occurrence of the failure in the reverse connection protection transistor to a sound output device such as a loudspeaker. Examples of the sound output device include a sound output device included in the "system or equipment including a reverse connection protection transistor" and an external sound output device connected to the "system or equipment including a reverse connection protection transistor".

The above-mentioned sound output device outputs the sound indicating occurrence of the failure in the reverse connection protection transistor; thus, for example, a user of the "system or equipment including a reverse connection protection transistor" and others are audibly notified of occurrence of the failure in the reverse connection protection transistor.

In addition, for example, the notification control unit causes data indicating occurrence of the failure in the reverse connection protection transistor to be transmitted to an external device such as a server of a manufacturer of the "system or equipment including a reverse connection protection transistor". The notification control unit causes, for example, a communication device included in the "system or equipment including a reverse connection protection transistor", or an external communication device which is connected to the "system or equipment including a reverse connection protection transistor" to transmit the data indicating occurrence of the failure in the reverse connection protection transistor. The communication device transmits the data indicating occurrence of the failure in the reverse connection protection transistor via radio communication or cable communication.

Examples of the communication device according to an embodiment of the present invention include a communication antenna and a radio frequency (RF) circuit (radio communication), an IEEE802. 15. 1 port and a transmission/reception circuit (radio communication), an IEEE802. 11 port and a transmission/reception circuit (radio communication), and a local area network (LAN) terminal and a transmission/reception circuit (cable communication).

The communication device transmitting the data indicating occurrence of the failure in the reverse connection protection transistor to the external device makes it possible for a user (for example, a person in charge of maintenance of the manufacturer of the "system or equipment including a reverse connection protection transistor") of the external device to recognize the failure diagnosed in the failure diagnosis circuit according to an embodiment of the present invention.

The notification control unit causes a notification of a diagnosis result in the diagnosis unit 106 to be issued by the method described above, for example.

Note that the notification control unit can cause a notification of a diagnosis result in the diagnosis unit 106 to be issued by any notification method capable of issuing a notification that a diagnosis has been made that a failure has occurred in the reverse connection protection transistor, such as visual notification by lighting a lamp, for example, or tactile notification by vibrating a vibration device.

In addition, the notification control unit may cause a notification that a diagnosis has not been made that a failure has occurred in the reverse connection protection transistor, for example, to be issued by any notification method.

[2-5] Examples of Effects of Failure Diagnosis Circuit According to Embodiment of the Present Invention (Effects Obtained by Using Failure Diagnosis Method According to Embodiment of the Present Invention)

In the failure diagnosis circuit according to an embodiment of the present invention, the diagnosis unit 106 diagnoses an open-circuit failure in the reverse connection protection transistor, on the basis of the output state of the control signal in the power supply control unit 104, and the voltage input to the terminal DIN.

Here, it is possible to diagnose whether an open-circuit failure has occurred in the reverse connection protection transistor by checking whether there is a change in the voltage input to the terminal DIN after power supply to the reverse connection protection transistor is stopped, as illustrated in FIGS. 4 and 5, for example.

Thus, the failure diagnosis circuit according to an embodiment of the present invention can diagnose an open-circuit failure in the reverse connection protection transistor.

Moreover, as described above, in the failure diagnosis circuit according to an embodiment of the present invention, an open-circuit failure in the reverse connection protection transistor is diagnosed on the basis of the output state of the control signal and the voltage input to the terminal DIN. Thus, the failure diagnosis circuit according to an embodiment of the present invention can diagnose an open-circuit failure in the reverse connection protection transistor more easily, as compared with the case of using the technology described in Patent Literature 1, for example.

In addition, in the failure diagnosis circuit according to an embodiment of the present invention, it is diagnosed whether an open-circuit failure has occurred in the reverse connection protection transistor, on the basis of whether a fall in the voltage input to the terminal DIN is detected after power supply to the reverse connection protection transistor is stopped. Therefore, the failure diagnosis circuit according to an embodiment of the present invention can, for example, diagnose an open-circuit failure in the reverse connection protection transistor, regardless of variation of the reverse connection protection transistor, the temperature of the reverse connection protection transistor, etc.

Consequently, the failure diagnosis circuit according to an embodiment of the present invention can diagnose an open-circuit failure in the reverse connection protection transistor more reliably than the failure diagnosis circuit 10 illustrated in FIG. 1. In addition, the failure diagnosis circuit according to an embodiment of the present invention can speedily make a diagnosis that an open-circuit failure has occurred in the reverse connection protection transistor.

Moreover, since an open-circuit failure in the reverse connection protection transistor is more reliably diagnosed by the failure diagnosis circuit according to an embodiment of the present invention, the reliability of the "system or equipment including a reverse connection protection transistor" can be improved. In addition, more reliable diagnosis of an open-circuit failure in the reverse connection protection transistor makes it possible to prevent the occurrence of an undesirable situation, such as a failure in a load, due to the occurrence of a reverse connection state.

Although, in the foregoing, description has been made by taking the failure diagnosis circuit as an embodiment of the present invention, the embodiment of the present invention is not limited to the above-mentioned embodiment. The embodiment of the present invention is also applicable to various systems and various pieces of equipment including a reverse connection protection transistor, such as vehicles such as cars (a vehicle system).

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST 10, 100 failure diagnosis circuit
12 amplification unit
14, 106 diagnosis unit
102 power supply unit
104 power supply control unit
Tr, Tr1 reverse connection protection transistor
Tr2 switching transistor

The invention claimed is:

1. A failure diagnosis circuit configured to diagnose an open-circuit failure in a reverse connection protection transistor that prevents flow of current in a direction opposite to a direction in a normal state in the case of a reverse connection state, the failure diagnosis circuit comprising:
   a power supply which includes a switching transistor that is electrically connected to a power source and the reverse connection protection transistor and is brought into an on state or an off state in response to a control signal applied to a control terminal, and in which power is supplied from the power source to the reverse connection protection transistor when the switching transistor is in the on state;
   a power supply controller that controls power supply to the reverse connection protection transistor and stop of the power supply by outputting the control signal to the switching transistor; and
   a diagnosis microcontroller, which includes a processor, that diagnoses an open-circuit failure in the reverse connection protection transistor on the basis of an output state of the control signal and a detection result of voltage between the switching transistor and the reverse connection protection transistor.

2. The failure diagnosis circuit according to claim 1, wherein the diagnosis microcontroller diagnoses an open-circuit failure in the reverse connection protection transistor on the basis of a change in the voltage after power supply to the reverse connection protection transistor is stopped.

3. The failure diagnosis circuit according to claim 2, wherein the diagnosis microcontroller makes a diagnosis that an open-circuit failure has occurred in the reverse connection protection transistor in the case where a fall in the voltage is not detected after power supply to the reverse connection protection transistor is stopped.

4. The failure diagnosis circuit according to claim 2, wherein the diagnosis microcontroller refrains from making a diagnosis that an open-circuit failure has occurred in the reverse connection protection transistor in the case where a fall in the voltage is detected after power supply to the reverse connection protection transistor is stopped.

5. The failure diagnosis circuit according to claim 1, further comprising:
   the reverse connection protection transistor.

6. A failure diagnosis method in a failure diagnosis circuit configured to diagnose an open-circuit failure in a reverse connection protection transistor that prevents flow of current in a direction opposite to a direction in a normal state in the case of a reverse connection state,
   the failure diagnosis circuit including a switching transistor that is electrically connected to a power source and the reverse connection protection transistor and is brought into an on state or an off state in response to a control signal applied to a control terminal,
   the failure diagnosis method comprising:
   controlling power supply to the reverse connection protection transistor and stop of the power supply by outputting the control signal to the switching transistor; and
   diagnosing, by a microcontroller that includes a processor, an open-circuit failure in the reverse connection protection transistor on the basis of an output state of the control signal and a detection result of voltage between the switching transistor and the reverse connection protection transistor.

* * * * *